United States Patent
Chen et al.

(10) Patent No.: US 9,758,289 B2
(45) Date of Patent: Sep. 12, 2017

(54) METHOD FOR MAKING CARTON BOTTOM

(71) Applicant: Shenzhen China Star Optoelectronics Technology Co., Ltd., Shenzhen, Guangdong (CN)

(72) Inventors: Shih Hsiang Chen, Guangdong (CN); Yi-cheng Kuo, Guangdong (CN); Qianshuang Hu, Guangdong (CN); Jiahe Cheng, Guangdong (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 398 days.

(21) Appl. No.: 14/588,436

(22) Filed: Jan. 1, 2015

(65) Prior Publication Data
US 2015/0107080 A1 Apr. 23, 2015

Related U.S. Application Data

(62) Division of application No. 13/576,395, filed on Jul. 31, 2012, now Pat. No. 8,978,892.

(51) Int. Cl.
| | |
|---|---|
| *H01L 21/673* | (2006.01) |
| *B29C 49/48* | (2006.01) |
| *B65D 81/133* | (2006.01) |
| *B65D 85/48* | (2006.01) |
| *B29C 49/00* | (2006.01) |
| *B29L 31/00* | (2006.01) |

(52) U.S. Cl.
CPC ........ *B65D 81/133* (2013.01); *B29C 49/0031* (2013.01); *B29C 49/48* (2013.01); *B65D 85/48* (2013.01); *H01L 21/67386* (2013.01); *B29L 2031/712* (2013.01); *Y10T 29/4998* (2015.01); *Y10T 29/49826* (2015.01)

(58) Field of Classification Search
CPC . H01L 21/67386; B65D 75/323; B65D 85/48; B65D 81/133; B29C 49/48; B29C 49/0031; Y10T 29/4998
See application file for complete search history.

(56) References Cited

U.S. PATENT DOCUMENTS 5,957,293 A * 9/1999 Pakeriasamy ..... H01L 21/67333
                                                         206/565

FOREIGN PATENT DOCUMENTS

| CN | 101100108 A | 1/2008 |
| CN | 201021387 Y | 2/2008 |
| CN | 201990008 U | 9/2011 |

* cited by examiner

Primary Examiner — Jermie Cozart
(74) Attorney, Agent, or Firm — Andrew C. Cheng

(57) ABSTRACT

The present invention provides a packaging carton for fragile, apparatus for making cartoon bottom, and method for making the carton bottom. The packaging carton includes a bottom and peripheral wall which jointly define a receiving space far storing fragile glass substrate with the bottom. The bottom has a skeleton configuration and is made from plastic blowing technology. By the forgoing, the present invention can effectively reduce the packaging cost, and which in turn reducing the cost of the product.

4 Claims, 4 Drawing Sheets

METHOD FOR MAKING CARTON BOTTOM

CROSS REFERENCE

This is a divisional application of prior application 13/576,395, now U.S. Pat. No. 8,978,892 B2 submitted on 07/31/2012, entitled "Packaging Carton for Fragile, Apparatus for Making Carton Bottom, and Method for Making Carton Bottom", which is a national stage application of PCT/CN2012/078453 submitted on 2012 Jul. 11, and which is based on and claims priority of Chinese Patent Application No. 201210229698.5 filed on 2012 Jul. 4, the entire contents of which are hereby incorporated by reference.

FIELD OF THE INVENTION

The present invention relates to a technical field of packaging, and more particularly to a packaging carton for fragile, apparatus for making cartoon bottom, and method for making the carton bottom.

DESCRIPTION OF PRIOR ART

The existing processes for manufacturing a liquid crystal display device generally includes the following steps:

Primary Array Process: in this process, the whole array substrate and color filter substrate are manufactured.

Intermediate Cell Process: in the process, the array substrate and the color filter substrate are married together, filling with liquid crystal, and then cutting into panels of pre-determined dimensions.

Post Module Process: in this process, those panels will be further incorporated with other vital components, such as the backlight module, the circuits, and frame so as to complete the manufacturing of the liquid crystal display device.

However, once the panels is prepared with pre-determined dimensions, the panels have to be properly packed into storage boxes so as to deliver to an assembling Factory for final assembling of LCD module.

Currently, the packaging carton for the fragile glass substrate is generally configured with a container with a lid removably attached on top. The container is generally made from expanded polypropylene (also known as EPP) with appropriate industrial technology. When the container is made from EPP, it consumes a great deal of material during the manufacturing processes. It is therefore inevitably increasing the cost.

SUMMARY OF THE INVENTION

It is an object of this invention to provide a packaging carton for fragile, apparatus for making cartoon bottom, and method for making the carton bottom.

In order to resolve the prior art issue, the present provides a technical solution by introducing a method for making a bottom of a packaging carton for fragile glass substrate, wherein the method includes the steps of: a) preparing a mold and a plastic blowing machine, wherein the mold is designed with ribs so as to create a bottom with hollowed configuration. b) Disposing plastic particles within the mold and heating up to molten state or disposing molten plastic particles into the mold. C) Blowing air into the mold with the plastic blowing machine so as to transform the molten plastic particles into a bottom of a packaging carton with skeleton configuration within the mold, and a peripheral wall with skeleton configuration surrounding the bottom, wherein the bottom and the peripheral wall are all with hollowed configuration. And d) providing a buffering tray having a lower configuration matched within the skeleton configuration of the bottom of the plastic carton and securing the buffering tray onto the bottom of the packaging carton, wherein a peripheral an upper surface of the bottom of the packaging carton is arranged with a first retaining device, and the bottom surface of the buffering tray is provided with a second retaining device corresponding to the first retaining device so as to securely attach the buffering tray with the bottom when the first and second retaining devices engaged with each other, wherein the buffering tray is made from polyethylene terephthalate or polystyrene, wherein the peripheral side wall and the bottom of the packaging carton are made from plastic.

In order to resolve the prior art issue, the present provides a technical solution by introducing a packaging carton for fragile glass substrate, characterized in that the packaging carton includes a bottom and peripheral wall. Wherein a receiving and packaging space is defined by the peripheral wall and the bottom, wherein the bottom has as skeleton configuration formed by plastic blowing machine.

Wherein the packaging carton further comprises a buffering tray. Wherein the buffering tray is disposed onto a bottom of the packaging carton, wherein the buffering tray has a lower configuration matched within the skeleton configuration of the bottom of the plastic carton.

Wherein that a peripheral an upper surface of the bottom of the packaging carton is arranged with a first retaining device, and the bottom surface of the buffering tray is provided with a second retaining device corresponding to the first retaining device so as to securely attach the buffering tray with the bottom when the first and second retaining devices engaged with each other.

Wherein that the first retaining device is a vertical blind hole, and the second retaining device is a vertical dowel post.

Wherein that the number of the blind hole and dowel post are four.

Wherein that the buffering tray is made from polyethylene terephthalate (PET) or polystyrene (PS).

Wherein the packaging carton further includes a lid attached to the top of the peripheral wall, wherein the lid has a skeleton configuration.

Wherein the peripheral wall and the bottom of the packaging carton are made from plastic material.

In order to resolve the prior art issue, the present provides a technical solution by introducing. an apparatus for making a bottom of a packaging carton for storing fragile glass substrate, characterized in that the apparatus includes a mold and a plastic blowing machine. Wherein the mold is provided with pattern so as to create a skeleton configuration, the blowing machine is used to supply compressed air into the mold to transform molten plastic into a bottom with a skeleton and peripheral wall with skeleton configuration.

The present invention can be concluded with the following advantages. As compared to the existing prior arts, the skeleton configuration of the bottom of the packaging carton can readily reduce the material use to construct the carton. By using plastic blowing machine, the requirements to the mold are largely reduced, therefore reducing the cost. In addition, since the bottom is configured with hollowed configuration with the plastic blowing technology, the constructing material can be further reduced. By the provision of the present invention, the packaging carton can effectively reduce the constructing material, cost of the mold, as the cost for manufacturing is also reduced accordingly.

DETAILED DESCRIPTION OF PREFERRED EMBODIMENT

Detailed description will be given with the accompanied drawings.

Figure 1:
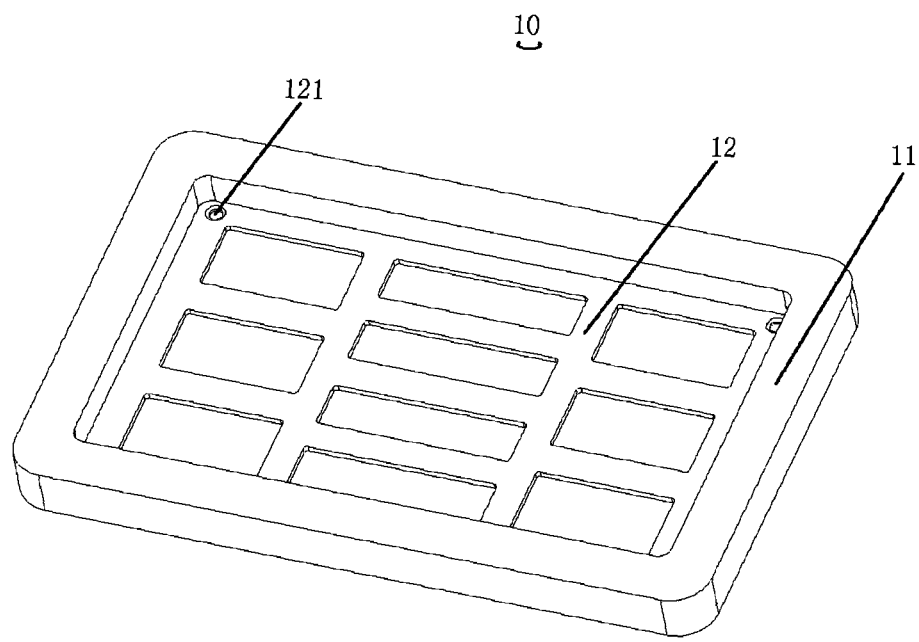
FIG. 1 is a perspective and illustrates view of a packaging carton for fragile made in accordance with the present invention.
Figure 2:
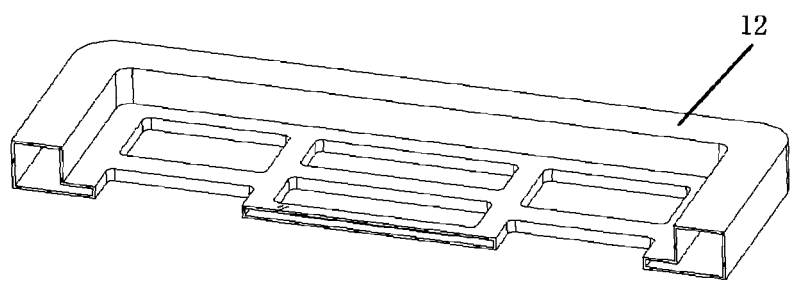
FIG. 2 is a cross sectional view of a bottom of the packaging carton shown in FIG. 2.

Referring now to FIGS. 1 and 2, which are a perspective and illustrate view of a packaging carton for fragile made in accordance with the present invention; and a cross sectional view of as bottom of the packaging eaten shown in FIG. 2, respectively. The packaging carton 10 includes a bottom 12 and a peripheral wall 11 which surround the bottom 12 of the packaging carton 10 so as to configure a receiving space to store fragile glass substrates therein. The bottom 12 has a skeleton configuration which is formed by blowing molten plastic material over mold designed with the skeletoned recesses or pattern with blowing machine. In this embodiment, both the bottom 12 and the peripheral wall 11 are preferably made from plastic material.

Currently, there exists a novel packaging carton which is different to the embodiment of the present invention. The feature of such packaging carton is: it has a plastic outer frame, and in four corners and on the middle of the longitudinal sides, EPP pads are arranged to serve as a shock-absorbing device when fragile workload is loaded therein. The bottom is a solid configuration, and which is injection molded. The plastic injection mold is: when the plastic particles are heated and transformed into a molten state, then the molten plastic material is injected with high pressure to a cavity of a mold. After the injection is completed, and the plastic material is cooled down, the plastic is removed from the cavity. With this technology, the molten plastic, has to be injected with comparably higher pressure, as a result, the mold has to carve from high grade steel which is also very expensive as the price of steel is proportional to its quality as well as rigidity. As compared to the plastic injection, the current invention can be concluded with the following advantages. The bottom with skeleton configuration can readily save the material used to configure the bottom of the packaging carton. The bottom of the packaging carton is created from plastic blowing, and this working principle of this plastic blowing is: using compressed air supplied into the mold in which the plastic particles have been heated to a molten state. When the molten plastic is blown by the compressed, it starts to swell in conforming to the internal contour of the cavity of the mold. The pressure is comparably lower then the injection mold. Accordingly, the grade and quality of the steel used in this regard is comparably lower, and the cost is therefore reduced. In addition, the bottom 12 of the packaging carton 10 can be formed with hollowed configuration, and this can thither reduce the cost of the bottom 12.

Figure 3:
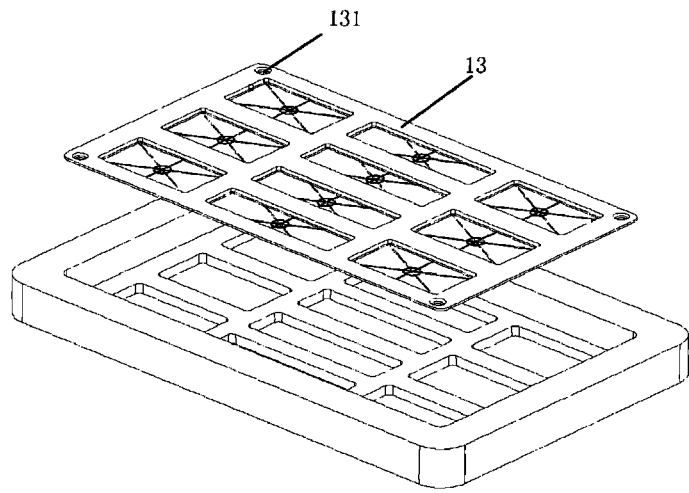
FIG. 3 is a perspective view of the packaging carton and the buffering tray before their assembly.
Figure 4:
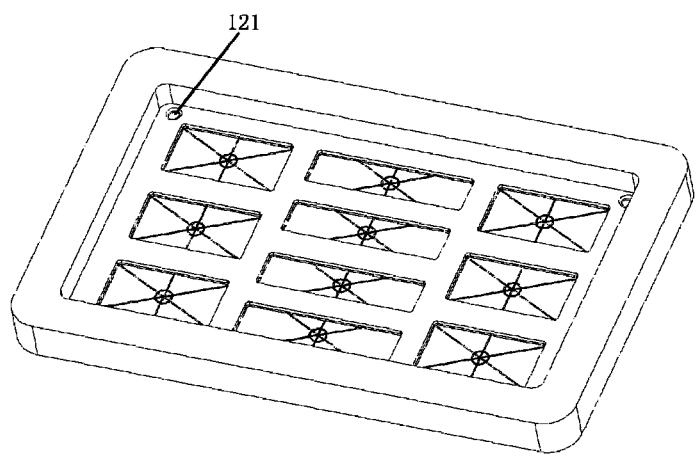
FIG. 4 is an illustration view showing the buffering tray is securely settled on the bottom of the packaging carton.

Referring to FIGS. 3 and 4, which are a perspective view of the packaging carton and the buffering tray before their assembly, and an illustration view showing, the buffering tray is securely settled on the bottom of the packaging carton, respectively. In the present invention, the packaging carton 10 further includes a buffering tray 13 which has a lower portion with contours matched with the skeleton configuration of the base 12 of the packaging carton 10. A peripheral an upper surface of the bottom 12 of the packaging, carton 10 is arranged with a first retaining device 121, and the bottom surface of the buffering tray 13 is provided with a second retaining device 131 corresponding to the first retaining device 121 so as to securely attach the buffering tray 13 with the bottom 12 when the first and second retaining devices 121, 113 engaged with each other.

In the current embodiment, the first retaining device 121 is preferably a vertical blind hole, and the second retaining device 131 is preferable a vertical dowel post extending downward. The number of the blind holes and the dowel post are four, and which are distributed on four corners of the top surface of the bottom 12, and the bottom surface of the buffering tray 13. Alternatively, the buffering tray 13 can be attached to the bottom 12 with any other suitable measurements without limited to what disclosed above. For example, bolts and nuts can be used to attach the buffering tray to the bottom of the packaging carton.

The material used to make the buffering tray 13 is preferably selected from a material with excellent shock-absorbing property. For example, it can be selected from polyethylene terephthalate (PET) and/or polystyrene (PS). During the manufacturing of the buffering tray, the material can be added with static-retarding agent so as to provide the buffering tray with static-suppression property. When the bottom 12 is arranged with the buffering tray 13 which supports the fragile glass substrate directly. This arrangement can directly prevent the fragile glass substrate from contacting with the bottom 12. Accordingly, the fragile glass substrate can be prevented from being shattered because of shock.

It should be noted that in the current embodiment, the skeleton pattern of the bottom of the packaging carton should not be limited to what has been disclosed. Other suitable skeleton designs can also be applied.

Figure 5:
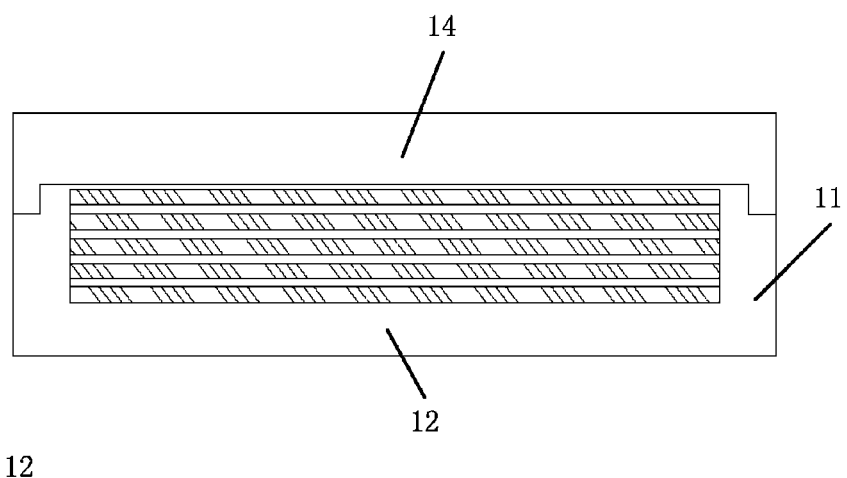
FIG. 5 is a cross sectional view of a lid shown in FIG. 1.

Furthermore, please refer to FIG. 5 which is a cross sectional view of a lid shown in FIG. 1. The packaging carton 10 further includes a lid 14 which covers on top of the peripheral wall 11 of the packaging carton 10. The lid 14 is preferably made with skeleton configuration so as to reduce the manufacturing cost.

In the current embodiment, with the mold being designed with the skeleton configuration using blowing machine to blow the molten plastic material over the mold, the bottom of the packaging carton can be readily made with skeleton as well as hollowed configuration. The bottom with skeleton configuration can readily reduce the cost; using the plastic blowing machine can readily reduce the cost on mold. In addition, the hollowed configuration of the skeletoned bottom can also reduce the cost. As a result, the overall manufacturing cost is reduced, which in turn reduces the cost of the product.

Figure 6:
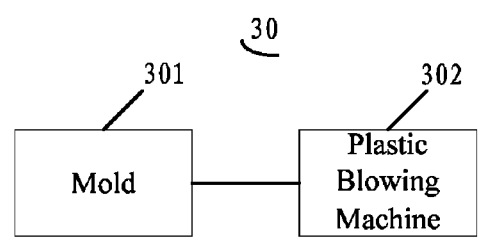
FIG. 6 is an illustrational block diagram representing the apparatus used to make the bottom of the packaging carton.

The present invention further includes an apparatus for manufacturing the bottom of the packaging carton for fragile glass substrate. Referring to FIG. 6, which is an illustrational block diagram representing the apparatus used to make the bottom of the packaging carton. The apparatus 30 includes a mold 301 and a plastic blowing machine 302. The mold 301 is used to form the product, i.e. the bottom in this embodiment. It is the prototype of the product. The blowing machine 302 is used to supply compressed air so as to blow the molten plastic over the contours within the mold 301 so as to create the intended product. The mold 301 is carved with intended patterns or designs, i.e. skeleton recesses in this embodiment. Once the molten plastic material is blown over the cavity of the mold 301, after the molten plastic material is cooled, then the skeletoned bottom and the peripheral wall of the packaging carton is preferably created.

In the present embodiment, the bottom with skeleton configuration can readily reduce the cost; using the plastic blowing machine can readily reduce the cost on mold. In addition, the hollowed configuration of the skeletoned bottom can also reduce the cost. As a result, the overall manufacturing cost is reduced, which in turn reduces the cost of the product.

Figure 7:
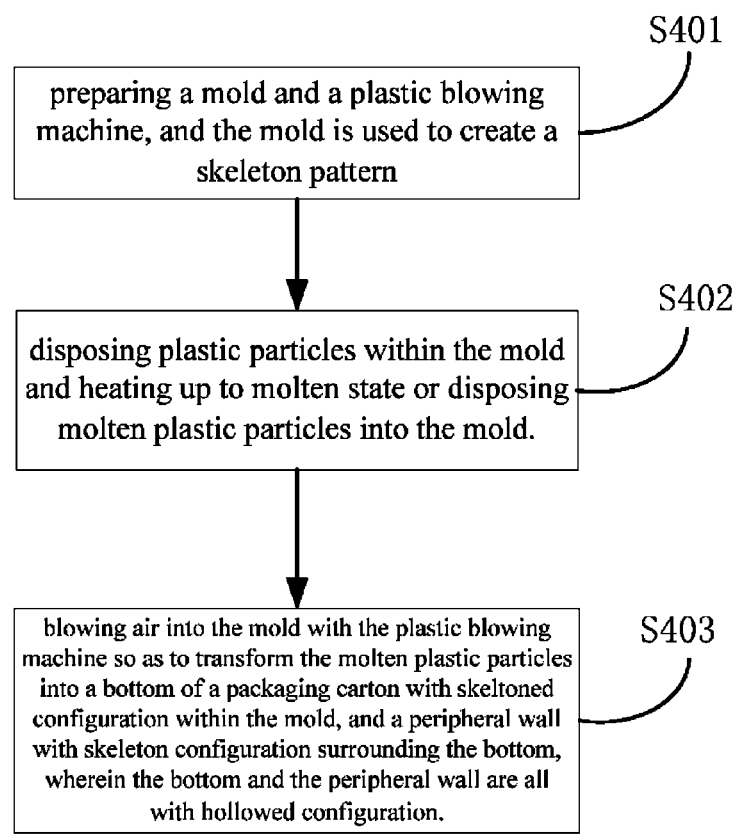
FIG. 7 is a flow chart illustrating the manufacturing process of the bottom of the packaging carton for fragile glass substrate made in accordance with the present invention.

The present invention further provides a method for making the bottom of the packaging carton. Referring to FIG. 7 which is a flow chart illustrating the manufacturing process of the bottom of the packaging carton for fragile glass substrate made in accordance with the present invention. The method includes the following steps.

Step S401: preparing a mold and a plastic blowing machine, and the mold is used to create a skeleton pattern.

The mold is a tool for making product, and it is a prototype of a product.

Step S402: disposing plastic particles within the mold and heating up to molten state or disposing molten plastic particles into the mold.

The plastic material is the base material for making the bottom of the packaging carton. Once it is heated, it will start to deform or even into molten type if the temperature exceeds a certain degrees.

Step S403: blowing air into the mold with the plastic blowing machine so as to transform the molten plastic particles into a bottom of a packaging carton with skeleton configuration within the mold, and a peripheral wall with skeleton configuration surrounding the bottom, wherein the bottom and the peripheral wall are all with hollowed configuration.

The plastic blowing machine is used to supply compressed air so as to blow the molten plastic material over the mold with patterns so as to create the product.

In the current embodiment, with the mold being designed with the skeleton configuration using blowing machine to blow the molten plastic material over the mold, the bottom of the packaging carton can be readily made with skeleton as well as hollowed configuration. The bottom with skeleton configuration can readily reduce the cost; using the plastic blowing machine can readily reduce the cost on mold. In addition, the hollowed configuration of the skeletoned bottom can also reduce the cost. As a result, the overall manufacturing cost is reduced, which in turn reduces the cost of the product.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A method for making a bottom of a packaging carton for fragile glass substrate, wherein the method includes the steps of:
   a) preparing a mold and a plastic blowing machine, wherein the mold is designed with ribs so as to create a bottom with hollowed configuration;
   b) disposing plastic particles within the mold and heating up to molten state or disposing molten plastic particles into the mold;
   c) blowing air into the mold with the plastic blowing machine so as to transform the molten plastic particles into a bottom of a packaging carton with skeleton configuration within the mold, and a peripheral wall with skeleton configuration surrounding the bottom, wherein the bottom and the peripheral wall are all with hollowed configuration;
   d) providing a buffering tray having a lower configuration matched within the skeleton configuration of the bottom of the plastic carton and securing the buffering tray onto the bottom of the packaging carton, wherein a peripheral an upper surface of the bottom of the packaging carton is arranged with a first retaining device, and the bottom surface of the buffering tray is provided with a second retaining device corresponding to the first retaining device so as to securely attach the buffering tray with the bottom when the first and second retaining devices engaged with each other, wherein the buffering tray is made from polyethylene terephthalate or polystyrene, wherein the peripheral side wall and the bottom of the packaging carton are made from plastic.

2. The method as recited in claim 1, characterized in that the first retaining device is a vertical blind hole, and the second retaining device is a vertical dowel post.

3. The method as recited in claim 1, characterized in that a lid is attached to the top of the peripheral wall after making the bottom of the packaging carton, wherein the lid has a skeleton configuration.

4. The method as recited in claim 2, characterized in that the number of the blind hole and dowel post are four, and each blind hole is on one of four corners of the upper surface of the bottom.

* * * * *